(12) United States Patent
Cho

(10) Patent No.: US 7,068,558 B2  
(45) Date of Patent: Jun. 27, 2006

(54) SEMICONDUCTOR MEMORY DEVICE HAVING ROW PATH CONTROL CIRCUIT AND OPERATING METHOD THEREOF

(75) Inventor: Jin-Hee Cho, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 136 days.

(21) Appl. No.: 10/877,037

(22) Filed: Jun. 24, 2004

(65) Prior Publication Data
US 2005/0094460 A1 May 5, 2005

(30) Foreign Application Priority Data
Oct. 31, 2003 (KR) ...................... 10-2003-0076848

(51) Int. Cl.
*G11C 7/00* (2006.01)

(52) U.S. Cl. ............ 365/222; 365/230.06; 365/230.08; 365/236

(58) Field of Classification Search ................ 365/222, 365/230.06, 230.08, 236
See application file for complete search history.

(56) References Cited

U.S. PATENT DOCUMENTS 6,744,685 B1 * 6/2004 Mizugaki .................. 365/222

* cited by examiner

*Primary Examiner*—Tuan T. Nguyen  
*Assistant Examiner*—Pho M. Luu  
(74) *Attorney, Agent, or Firm*—Blakely Sokoloff Taylor & Zafman

(57) ABSTRACT

A semiconductor memory device having a row path control circuit for reducing a peak current. The semiconductor memory device including: a bank controller for activating the bank signal as a first and a second bank driving signals; an inner address counter for generating an internal address in response to the refresh signal; a row address latch for selecting one of the internal address and the inputted address; a first decoder for decoding the row address in response to the first bank driving signal; a second decoder for decoding the row address in response to the second bank driving signal; a first row controller for activating a first amplifier enable signal in response to the first bank driving signal; a second row controller for activating a second amplifier enable signal in response to the second bank driving signal; and a amplifier for amplifying memory cell data of the activated word line.

20 Claims, 13 Drawing Sheets

SEMICONDUCTOR MEMORY DEVICE HAVING ROW PATH CONTROL CIRCUIT AND OPERATING METHOD THEREOF

FIELD OF THE INVENTION

The present invention relates to semiconductor design technique; and, more particularly, to a semiconductor memory device having a row path control circuit and an operating method.

BACKGROUND OF THE INVENTION

Generally, data is stored as charge in an isolated cell capacitor. Because the capacitor cannot be perfect, the stored charge is leaked outside due to leakage current. Accordingly, before data fade out completely, the stored data should be amplified to be re-stored, which is called a refresh operation.

The refresh operation is evoked when an external command is received. In response to the external command, a word line corresponding to a row address is turned on and, in turn, activates a sense amplifier. During the refresh operation, there is no data input/output.

There are roughly two kinds of refresh operation schemes, a self refresh and an auto refresh. The entire memory cells are refreshed in response to one command input in the self refresh while respective refresh commands should be inputted every time in the auto refresh.

For reference, it will be described for timing of the refresh operation.

First, refresh time means time until the entire memory cells lost data, which is the period between one refresh on a particular memory cell and the next refresh. This is related to memory cell process or the size of the cell. Further, the number of RAS signals that are required to refresh the entthe number of RAS signals that is required for completely refresh the entire cells in a semiconductor memory device is called as a refresh cycle.

Next, it will be described for generation of an internal control signal for the refresh operation with a row path controlling circuit of the semiconductor memory device.

FIG. 1 provides a block diagram of a semiconductor memory device having a row path control circuit in prior art.

Referring to FIG. 1, the semiconductor memory device in prior art comprises an input buffer/command decoding unit 10 for receiving external commands CLK, CKE, /RAS, /CAS, /WE to generate operating signals REF, ACT, RD, WT, BAj, an internal address counting unit 11 for receiving the refresh signal REF to generate an internal address IAX<0~i>, a row address latching unit 12 for outputting a row address AX<0~i> under control of an active command ACT_COM and the refresh signal REF, a column address latching unit 13 for outputting a column address AY<0~i> under control of the read signal RD and the write signal WT, a row pre-decoding unit 14 for decoding a part of the row address AX<0~i>, a column pre-decoding unit 15 for decoding a part of the column address AY<0~i>, a row decoding unit 18 for activating a word line WL by the output signal of the row pre-decoding unit 14, a column decoding unit 21 for decoding the output signal of the column pre-decoding unit 15 to select a column line, a row controlling unit 16 for receiving the bank signal Bai of the input buffer/command decoding unit 10 to generate a sense amplifier enable signal SAEN, an SA controlling unit 17 for controlling a sense amplifier block 19 under control of the sense amplifier enable signal SAEN, a memory array block 20 having a number of unit memory cells, and the sense amplifier block 19 for sensing and amplifying the memory cell data of the word line that is selected by the SA controlling unit 17.

FIG. 2 shows an internal circuit diagram of the row address latching unit 12 in FIG. 1.

Referring to FIG. 2, the row address latching unit 12 includes an inner latching unit 25 for outputting the internal address IAX<0,i> as the row address AX<0~i> in response to activation of the refresh signal REF, and an outer latching unit 26 for outputting the address A<0~i> as the row address AX<0~i> in response to activation of the external input active command ACT_COM.

In particular, the inner latching unit 25 includes an inverter I1 for inverting the refresh signal, a PMOS transistor PM1 having the output signal of the inverter I1 as its gate input, a PMOS transistor PM2 having the internal address IAX<0~i> as its gate input, the PMOS transistors PM1, PM2 being serially coupled to each other between a power voltage VDD and an output node, an NMOS transistor NM1 having the internal address IAX<0~i> as its gate input, and an NMOS transistor NM2 having the refresh signal REF as its gate input, the NMOS transistors NM1, NM2 being serially coupled to each other between the output node and a power voltage VSS.

The outer latching unit 26 includes an inverter I2 for inverting the active command ACT_COM, PMOS transistor PM3 having the output signal of the inverter I2 as its gate input, a PMOS transistor PM4 having the address A<0~i> as its gate input, the PMOS transistors PM3, PM4 being serially coupled to each other between the power voltage VDD and the output node, an NMOS transistor NM3 having the address A<0~i> as its gate input, and an NMOS transistor NM4 having the active command ACT_COM as its gate, the NMOS transistors NM3, NM4 being serially coupled to each other between the output node and the power voltage VSS.

FIG. 3 describes an internal circuit diagram of a bank driving signal generating unit in the input buffer/command decoding unit 10 in FIG. 1.

Referring to FIG. 3, the bank signal generating unit is formed with a cross-coupled NAND latch having the active signal ACT as a set signal and having a pre-charge signal PRE and a refresh pre-charge signal REBA as reset signals to generate the bank signal BAi.

Next, it will be described for the normal operation with active command input and the refresh operation with refresh command input in the operation of the semiconductor memory device having the row path controlling unit.

First, in the normal operation, the inputted active command ACT_COM is activated to the active signal ACT through the input buffer/command decoding unit 10. In turn, the address A<0~i> that is inputted along with the external command is outputted as the row address AX<0~i> through the row address latching unit 12 that is controlled by the active command ACT_COM and goes through the row pre-decoding unit 14 and the row decoding unit 18 to activate the corresponding word line WL. Further, the bank signal generating unit activates the bank signal Bai in response to the active signal ACT. In turn, the row controlling unit 16 activates the sense amplifier enable signal SAEN in response to activation of the bank signal Bai to make the sense amplifier enable signal SAEN be activated through the SA controlling unit 17 to sense and amplify the memory cell data. After that, the input buffer/command decoding unit 10 decodes the external commands CLK, CKE, /RAS, /CAS, /WE to activate the read signal RD or the write signal WT to control the column address latching unit 13 to output the inputted address A<0~i> as the column address AY<0~i>. The column address AY<0~i> goes through the column pre-decoding unit 15 and the column decoding unit 21 to perform a read operation by selectively outputting data from the sense amplifier block 19 or perform a write operation by over-writing external data onto the sense amplifier block 19. The operation is finished when the pre-charge command PRE_COM is inputted.

Next, when the external commands CLK, CKE, /RAS, /CAS, /WE are inputted, the refresh signal is activated by the input buffer/command decoding unit 10. In turn, the inner address counting unit 11 generates the internal address IAX<0~i> under control of the refresh signal REF. The internal address IAX<0~i> is outputted as the row address AX<0~i> through the row address latching unit 12 that is controlled by the refresh signal REF, to go through the row pre-decoding unit 14 and the row decoding unit 18 to activate the corresponding word line WL. Further, the bank signal generating unit activates the bank signal Bai in response to the active signal ACT. In turn, the row controlling unit 16 activates the sense amplifier enable signal SAEN in response to activation of the bank signal Bai to make the sense amplifier block 19 activated by the SA controlling unit 17 to sense and amplify the memory cell data in the selected word line WL. The memory cell data that is amplified by the sense amplifier block 19 is stored at the memory array block 20 and, then, the refresh operation is finished in response to activation of the refresh pre-charge signal REBA.

FIG. 4 exemplifies a timing diagram of the normal operation of the block in FIG. 1.

Referring to FIG. 4, the inputted active command ACT_COM is activated to the active signal ACT and, simultaneously, the inputted address A(0) is activated to the row address AX(0). In turn, the bank signal Bai is activated in response to the active signal ACT and the word line WL0 and the sense amplifier enable signal SAEN of the corresponding bank are activated. In turn, in response to the input of the pre-charge command PRE_COM, the bank signal Bai, the word line WL0 and the sense amplifier enable signal SAEN are deactivated.

After that, when the active command and address A(m) are inputted, another normal operation for the word line WLm begins.

FIG. 5 represents a timing diagram of the refresh operation of the block in FIG. 1.

Referring to FIG. 5, in response to input of an auto-refresh command Auto Refresh_COM, the refresh signal REF is activated. The internal address IAX(0) is generated in response to activation of the refresh signal REF and activated to the row address AX(0). The bank signal Bai is activated by the active signal ACT that is activated in response to the refresh signal REF so as to activate the corresponding word line WL0 and the sense amplifier enable signal SAEN. In turn, the bank signal Bai is deactivated to deactivate the refresh signal REF, the word line WL0 and the sense amplifier enable signal SAEN.

After that, the auto-refresh command AutoRefresh_COM is inputted again, the sequential internal address IAX(1) is generated to refresh the next word line WL1 in the bank.

For the reference, the period between the input of the active command and the input of the next active command is called as RAS cycle tRC and the minimum period by which the auto-refresh command can be inputted is called as tRCmin. FIGS. 4 and 5 show the activation of the internal control signals for one period of tRC after the active command and the address are inputted.

On the hand, Table 1 is provided to compare the refresh operation of a 256 Mb/512 Mb memory device to a 1 Gb memory device in JEDEC(Jointed Electron Device Engineering Council) specification.

TABLE 1

| Density | 256 Mb/512 Mb | 1 Gb |
| --- | --- | --- |
| Row Add. | A0–A12 | A0–A13 |
| # of Row | 8192 ea | 16384 ea |
| TRFC (min) | 72 ns @DDR333 | 120 ns |
| tREFI | 7.8 us | 7.8 us |
| Refresh Cycle | 8 K/64 ms | 8 K/64 ms |
| # of Active WL per Bank | 1 ea @tRFC (min) | 2 ea @tRFC (min) |

Referring to Table 1, the 256 Mb/512 Mb memory device has 8192 word lines with 13 row addresses A0–A12 while the 1 Gb memory device has 16384 word lines with 14 row addresses A0–A13. On the other hand, both of the 256 Mb/512 Mb memory device and the 1 Gb memory device have the same refresh cycle specification 8 K/64 ms. Because the 1 Gb memory device has 16 K word lines per bank, it should activate two times of word lines during the same tRFC compared to the 256 Mb/512 Mb memory device to follow the specification for performing 8K times refresh operations during 64 ms.

Accordingly, while 1 word line per bank is activated in the refresh operation in prior art, the 1 Gb memory device should activates two times of the word lines, which has relative weakness to peak current.

Further, because the tRFCmin=72 ns of the 256 Mb/512 Mb memory device is different from the tRFCmin=120 ns of the 1 Gb memory device, two memory devices cannot be used in a system that does not support both of the tRFCmin.

SUMMARY OF THE INVENTION

It is, therefore, a primary object of the present invention to provide a semiconductor memory device having a row path control circuit for reducing peak current or using semiconductor memory devices having different tRC from each other in a system.

Another object of the present invention is to provide an operating method for a semiconductor memory device having a row path control circuit.

In accordance with the present invention, there is provided a semiconductor memory device comprising a memory array block having a number of unit memory cells; a command decoding unit receiving external commands for generating a read signal, a write signal, a bank signal, an active signal and a refresh signal; a bank controlling unit for activating the bank signal as a first bank driving signal in response to the refresh signal and activating as a second bank driving signal after a delay; an inner address counting unit for generating an inner address in response to the refresh signal; a row address latching unit for selecting one of the inner address and the inputted address to output a row address; a first decoding unit for decoding the row address in response to the first bank driving signal to activate a word line in the memory array block; second decoding unit for decoding the row address in response to the second bank driving signal to activate a word line in the memory array block; first row controlling unit for activating a first sense amplifier enable signal in response to the first bank driving signal; second row controlling unit for activating a second sense amplifier enable signal in response to the second bank driving signal; and a sense amplifier block for sensing and amplifying memory cell data of the activated word line in response to the first sense amplifier enable signal and the second sense amplifier enable signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 6:
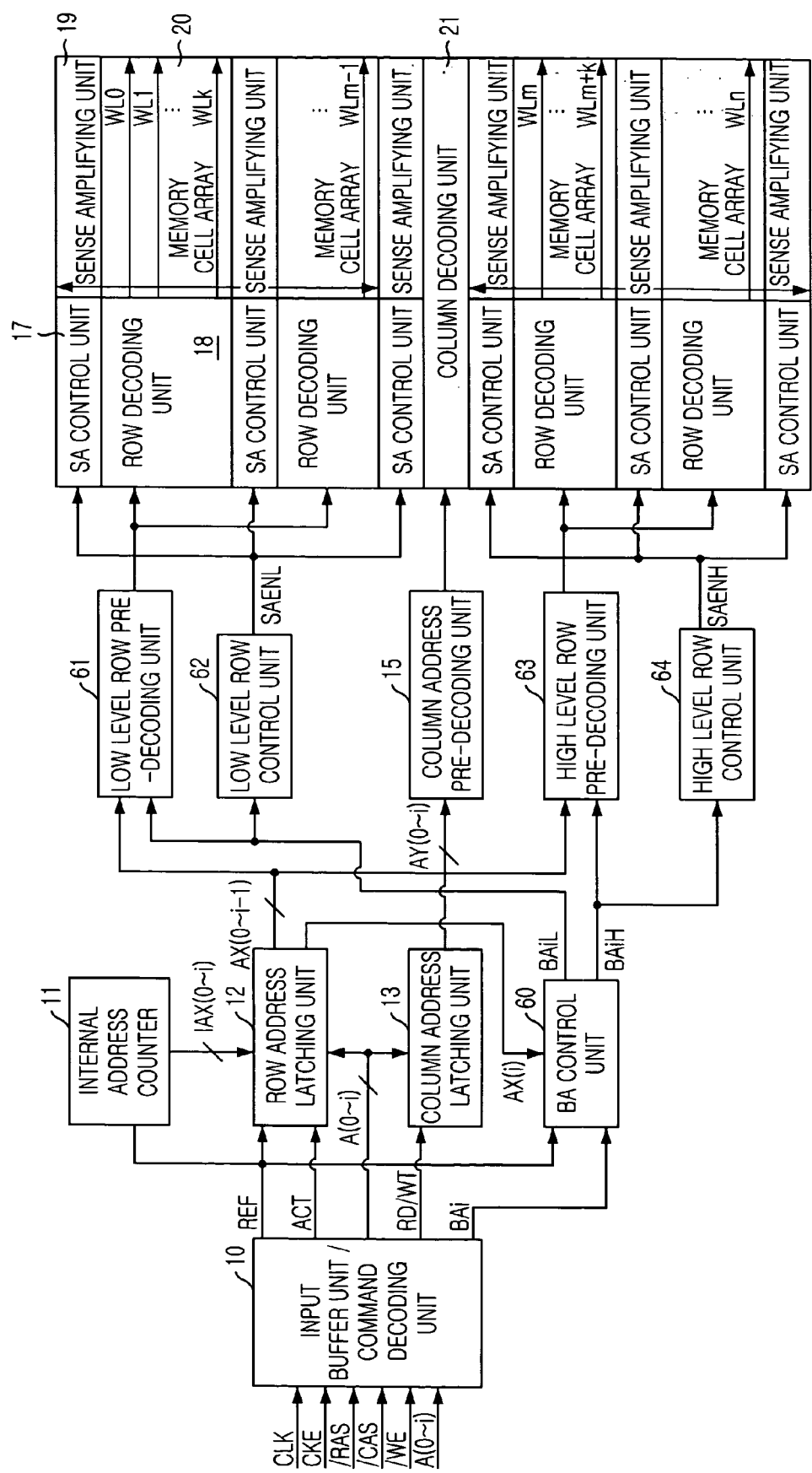
FIG. 6 illustrates a block diagram of a semiconductor memory device having a row path control circuit in accordance with one embodiment of the present invention.

FIG. 6 illustrates a block diagram of a semiconductor memory device having a row path control circuit in accordance with one embodiment of the present invention.

Referring to FIG. 6, the semiconductor memory device having a row path control circuit comprises an input buffer/command decoding unit 10 for receiving external commands CLK, CKE, /RAS, /CAS, /WE to generate control signals REF, ACT, RD, WT, BAi, an inner address counting unit 11 for receiving the refresh signal REF to generate an internal address IAX<0~i>, a row address latching unit 12 for outputting a row address AX<0~i> under control of the active command ACT_COM and the refresh signal REF, a column address latching unit 13 for outputting a column address AY<0~i> under control of the read signal RD and the write signal WT, a column pre-decoding unit 15 for decoding a part of the column address AY<0~i>, a BA controlling unit 60 for outputting a lower bank signal BAiL and an upper bank signal BAiH in response to the refresh signal REF, a lower row controlling unit 62 for generating a lower sense amplifier enable signal SAENL in response to the lower bank signal BAiL, an upper row controlling unit 64 for generating an upper sense amplifier enable signal SAENH in response to the upper bank signal BAiH, a lower row pre-decoding unit 61 and an upper row pre-decoding unit 63, each for decoding a part of the row address AX<0~i>, a row decoding unit 18 for activating a word line WL by using the output signals from the lower row pre-decoding unit 61 and the upper row pre-decoding unit 63, a column decoding unit 21 for decoding the output signal of the column pre-decoding unit 15 to select a column line, a memory array block 20 having a number unit memory cells, a SA controlling unit 17 for activating a sense amplifier block 19 in response to the lower sense amplifier enable signal SAENL and the upper sense amplifier enable signal SAENH, and the sense amplifier block 19 for sensing and amplifying the memory cell data in the selected word line under control of the SA controlling unit 17.

The semiconductor memory device according to the embodiment of the present invention is significantly different from the conventional device in that one bank is divided to be independently controlled. The BA controlling unit 60 uses the most significant bit AX<i> of the row address to tell between two halves of the bank and generates the lower bank signal BAiL and the upper bank signal BAiH. Further, there are included the pre-decoding units 61, 63 and the row controlling units 62, 64 that are controlled by the bank signals BAiL, BAiH, correspondingly.

Figure 1:
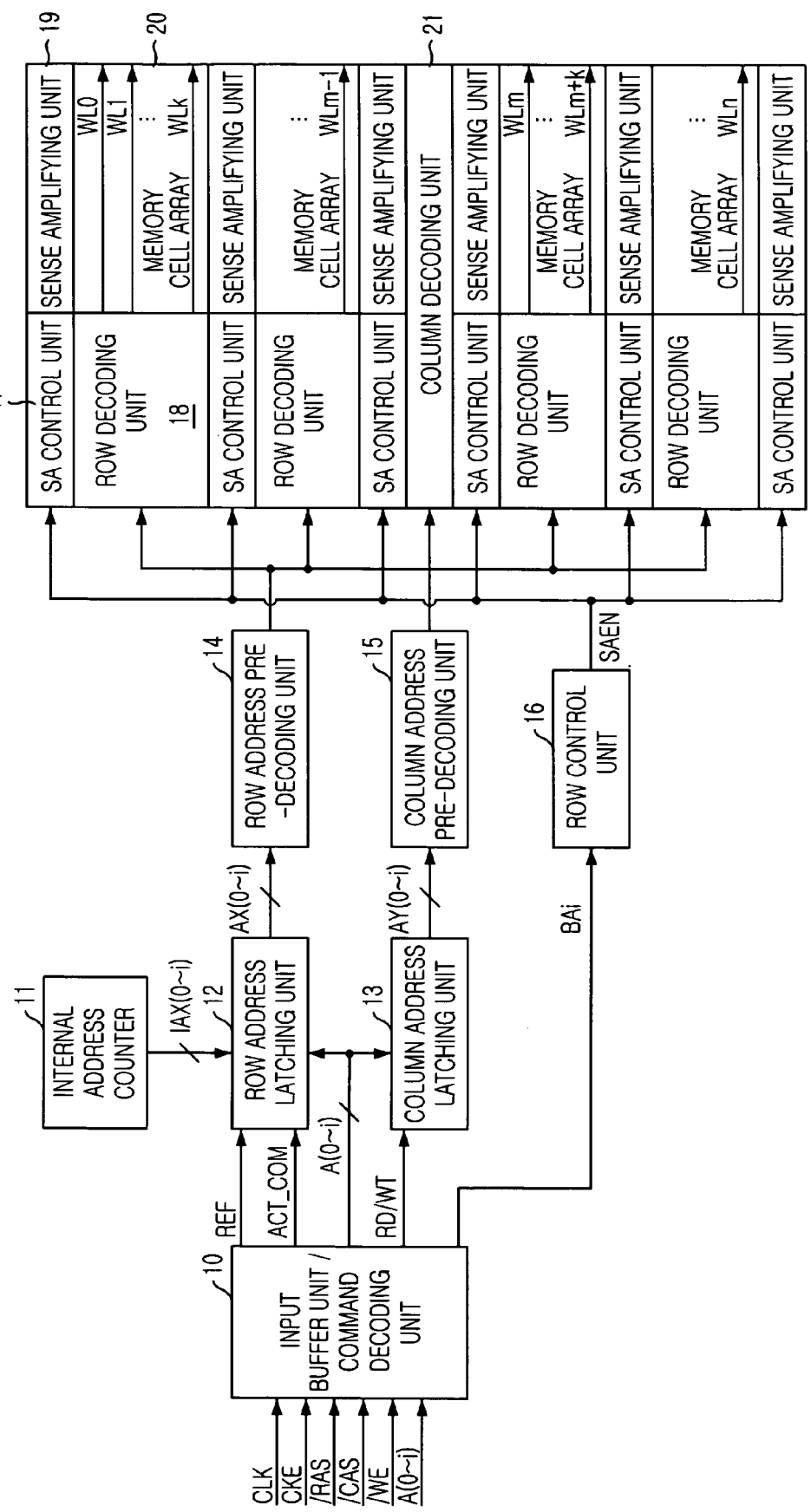
FIG. 1 provides a block diagram of a semiconductor memory device having a row path control circuit in prior art.
Figure 2:
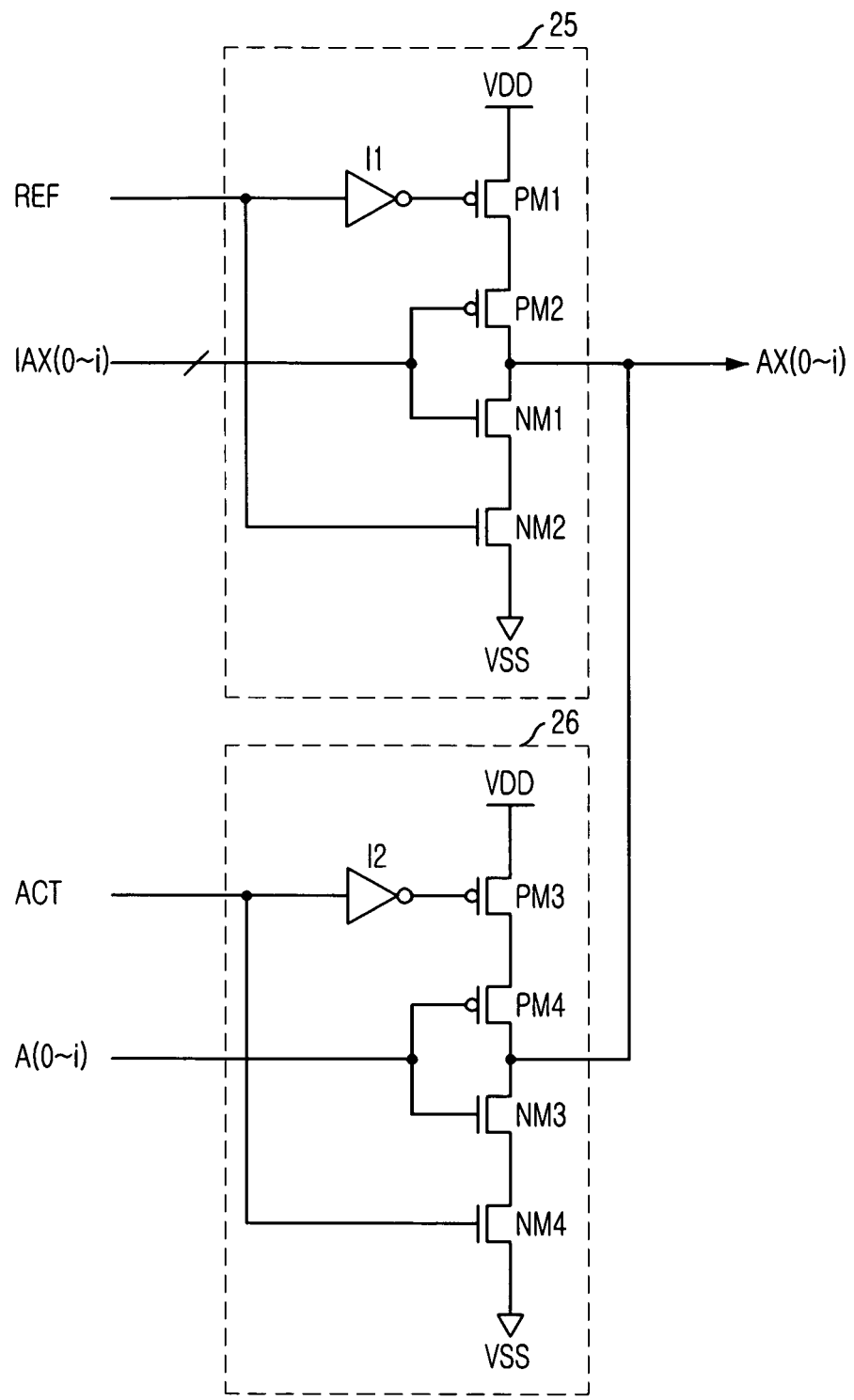
FIG. 2 shows an internal circuit diagram of a row address latching unit in FIG. 1.
Figure 3:
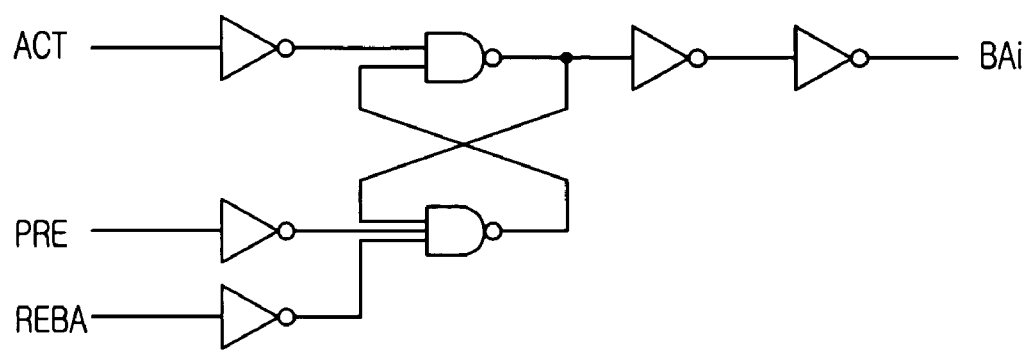
FIG. 3 describes an internal circuit diagram of a bank signal generating unit in FIG. 1.
Figure 4:
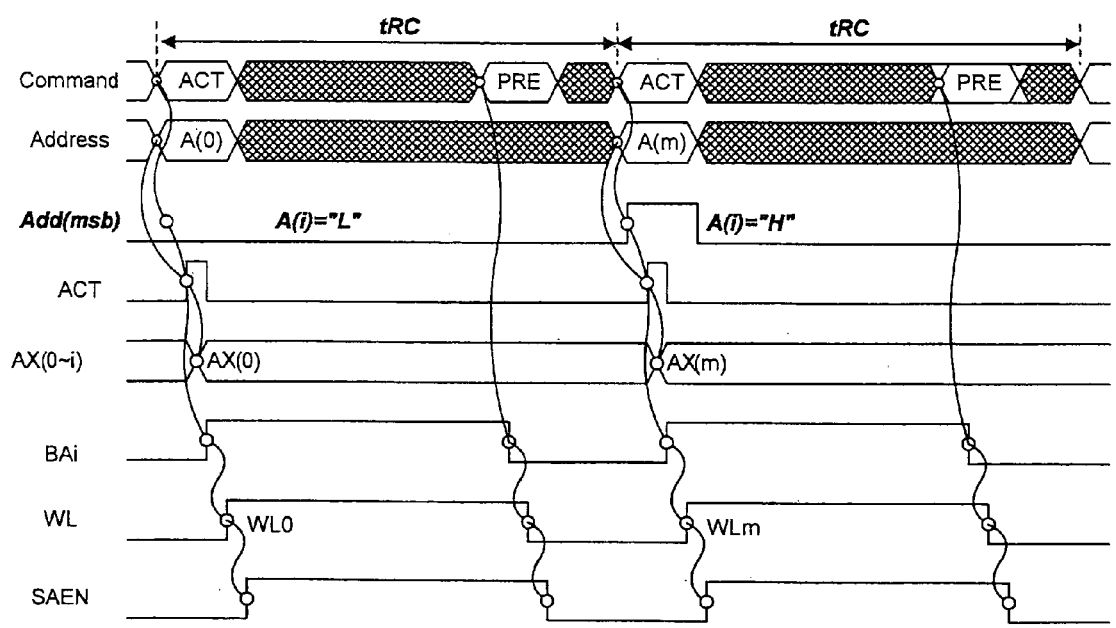
FIG. 4 exemplifies a timing diagram of normal operation of the block in FIG. 1.
Figure 5:
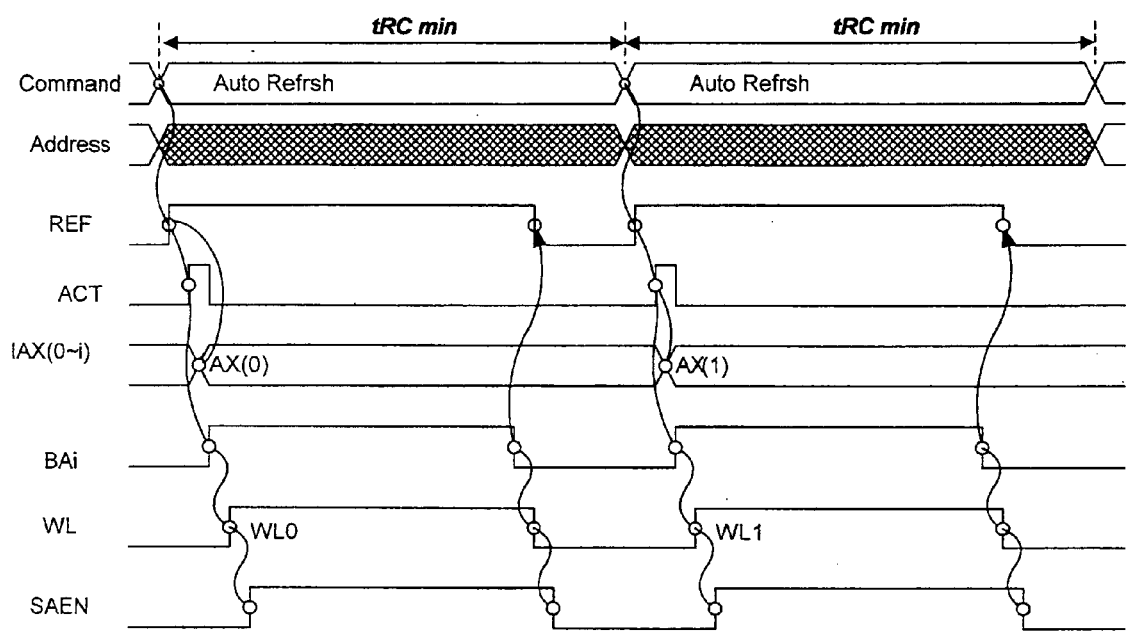
FIG. 5 represents a timing diagram of refresh operation of the block in FIG. 1.

Accordingly, comparing the block in FIG. 6 to the block in FIG. 1, the semiconductor memory device of the present invention further includes the BA controlling unit 60 for generating the lower bank signal BAiL and the upper bank signal BAiH from the bank signal BAi, separately, in response to the refresh signal REF, the lower row pre-decoding unit 61 and the upper row pre-decoding unit 63, separately, and the lower row controlling unit 62 and the upper row controlling unit 64, separately.

Figure 7:
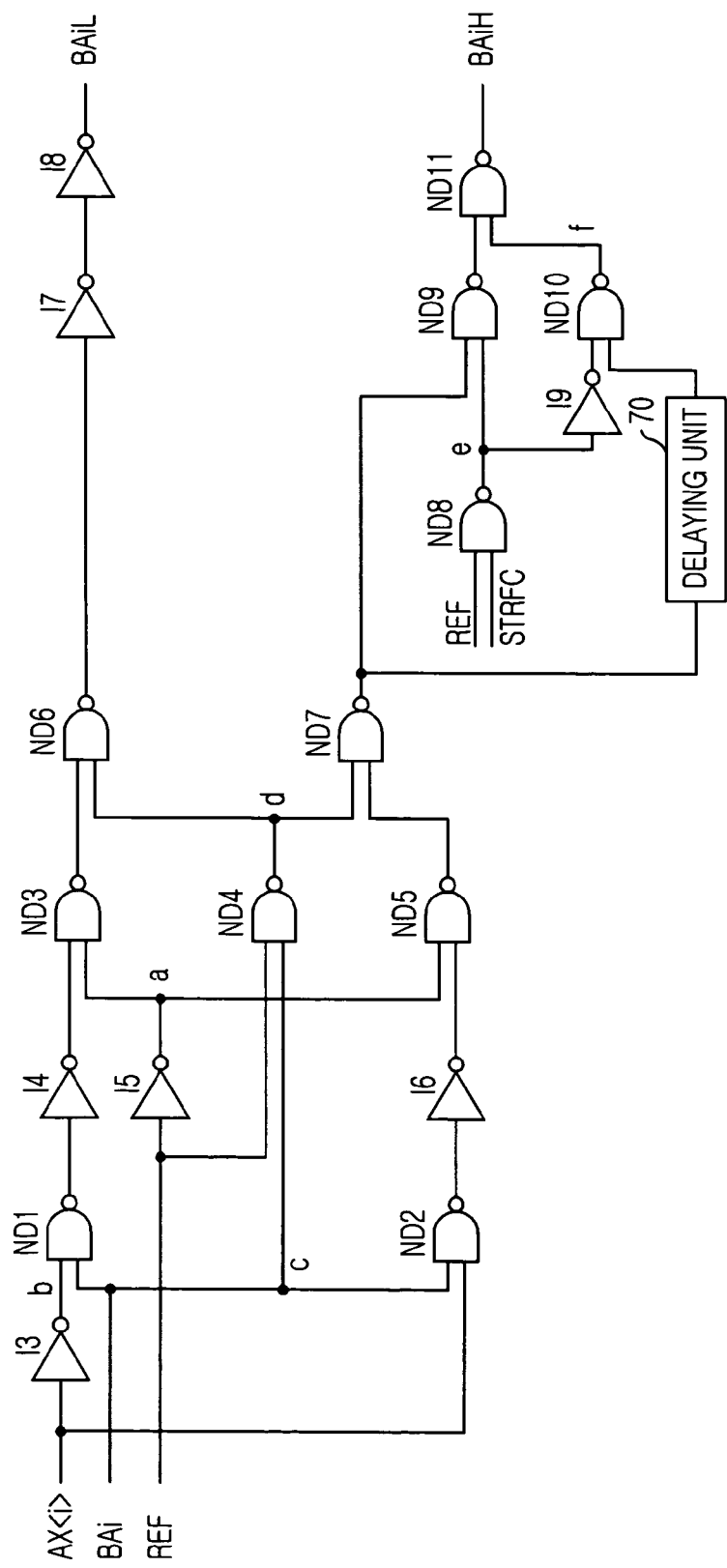
FIG. 7 shows an internal circuit diagram of a BA controlling unit in FIG. 6.

FIG. 7 shows an internal circuit diagram of the BA controlling unit 60 in FIG. 6.

Referring to FIG. 7, the BA controlling unit 60 includes an inverter I3 receiving the row address AX<i>, a NAND gate ND1 receiving a node b of the inverter I3 and the bank signal BAi, a NADN gate ND2 receiving the row address AX<i> and the bank signal BAi, an inverter I4 for inverting the output signal of the NAND gate ND1, an inverter I5 for inverting the refresh signal REF, an inverter I6 for inverting the output signal of the NAND gate ND2, a NAND gate ND3 receiving the output signal of the inverter I4 and a signal on a node a of the inverter I5, a NAND gate ND4 receiving the bank signal BAi on a node c and the refresh signal REF, a NAND gate ND5 receiving the node a and the output signal of the inverter I6, a NAND gate ND6 receiving a signal on a node d of the NAND gate ND4 and the output signal of the NAND gate ND3, a NAND gate ND7 receiving the signal on the node d of the NAND gate ND4 and the output signal of the NAND gate ND5, an inverter chain I7, I8 for latching the output signal of the NAND gate ND6 to output the lower bank signal BAiL, a NAND gate ND8 receiving the refresh signal REF and a selecting signal STRFC, a NAND gate ND9 receiving a signal on a node e of the NAND gate ND8 and the output signal of the NAND gate ND7, an inverter I9 receiving the signal on the node e, a delaying unit 70 for delaying the output signal of the NAND gate ND7, a NAND gate ND10 receiving the output signal of the delaying unit 70 and the output signal of the inverter I9, and a NAND gate ND11 receiving a signal on a node f of the NAND gate ND10 and the output signal of the NAND gate ND9 to output the upper bank signal BAiH.

First, when the refresh signal REF is logic level L, the nodes a, d, e, f are logic level H so that the NAND gates ND3, ND5, ND6, ND7, ND9, ND11 that have them as their inputs operate as inverters. That is, the BA controlling unit 60 is substantially operated such that it is formed with an AND gate receiving the inverted row address AX<i> and the bank signal BAi, and an AND gate receiving the row address AX<i> and the bank signal BAi, so as to activate the lower bank signal BAiL or the upper bank signal BAiH depending on the logic value of the row address AX<i>.

When the refresh signal REF is logic level H and the selecting signal STRFC is logic level L, the node e is logic level H so that the NAND gates ND4, ND6, ND7 operate as inverters, and, accordingly, the NAND gates ND9, ND11 also operate as inverters because of the selecting signal STRFC. Accordingly, if the refresh signal REF and the bank signal BAi are activated, both of the lower bank signal BAiL and the upper bank signal BAiH are activated simultaneously.

On the other hand, when the refresh signal REF is logic level H and the selecting signal STRFC is logic level H, the node e has logic level H because of the selecting signal STRFC so that the NAND gates ND10, ND11 operate as inverters to output the output signal of the delaying unit 70. Accordingly, when the refresh signal REF and the bank signal Bai are activated, the lower bank signal BAiL is activated and then the upper bank signal BAiH is activated after the delay.

Figure 8A:
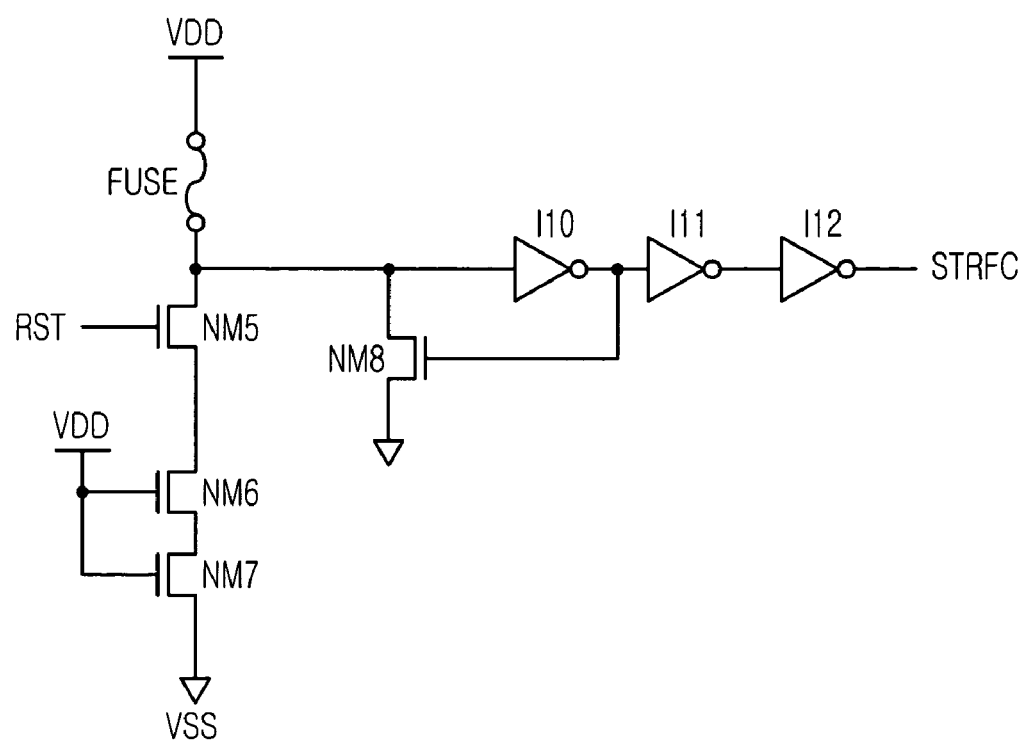
FIGS. 8a and 8b are internal circuit diagrams of embodiments of a selecting signal supplying unit.
Figure 8B:
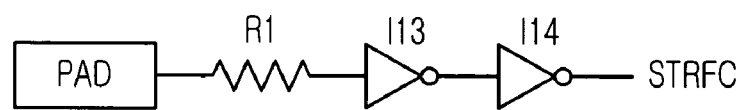

FIGS. 8a and 8b are internal circuit diagrams of embodiments of the selecting signal supplying unit.

First, Referring to FIG. 8a, the selecting signal supplying unit includes a fuse.

The selecting signal supplying unit includes NMOS transistors NM6, NM7 receiving the power voltage VDD as their gate inputs, respectively, an NMOS transistor NM5 receiving the reset signal RST as its gate input, the transistors NM5, NM6, NM7 being serially arranged between the power voltage VSS and a node, a fuse coupled between the power voltage VDD and the node, an inverter I10 for inverting the signal on the node, an NMOS transistor NM8 having the output signal of the inverter I10 as its gate input and a drain-source path between the node and the power voltage VSS, and an inverter chain I11, I12 for latching the output signal of the inverter I10 to output it as the selecting signal STRFC.

When the fuse is connected in a default case, the selecting signal STRFC is logic level L, while the selecting signal STRFC is logic level H when the fuse is disconnected.

Next, referring to FIG. 8b, the selecting signal supplying unit uses pad bonding and includes a pad, a resistor R1 and an inverter chain I13, I14, all being serially coupled to output the selecting signal STRFC.

When the pad is bonded to the power voltage VDD, the selecting signal STRFC has logic level H, while the selecting signal STRFC has logic level L when the pad is bonded to the ground voltage VSS.

Figure 9:
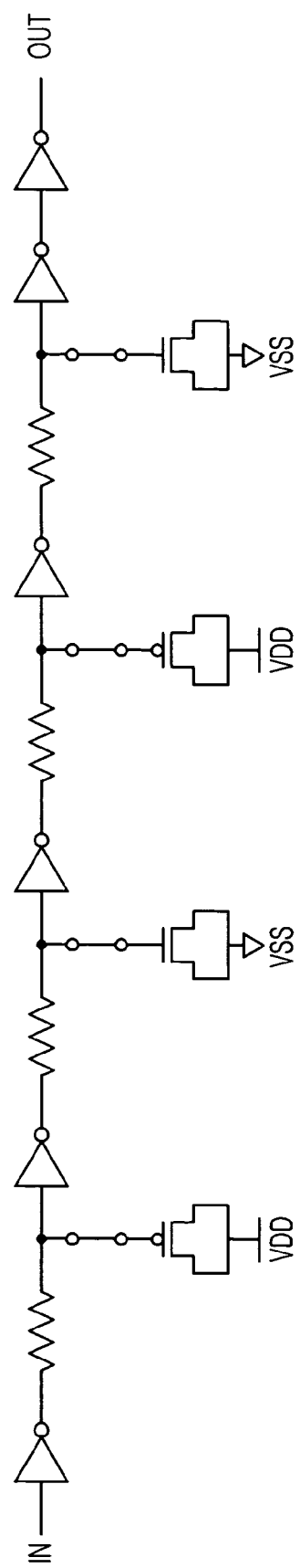
FIG. 9 provides an internal circuit diagram of a delaying unit in FIG. 7.

FIG. 9 provides an internal circuit diagram of the delaying unit 70 in FIG. 7.

Referring to FIG. 9, the delaying unit 70 includes a number of serially coupled blocks to delay an input signal, each block being formed with an inverter for inverting the input signal, a resistor for delaying the output signal of the inverter, and a capacitor coupled to the resistor in parallel.

Next, it will be described for the operation of the normal operation from an active command and the refresh operation from a refresh command in a semiconductor memory device having a row path controlling circuit according to one embodiment of the present invention.

First, it will be described for the normal operation. The input buffer/command decoding unit 10 activates the externally inputted active command ACT_COM to the active signal ACT. The row address latching unit 12 under control of the active command ACT_COM outputs the address A<0~i> that is inputted along with the external command as the row address AX<0~i>. The bank signal generating unit generates the bank signal BAi by the active signal ACT. The BA controlling unit 60 receives the bank signal BAi activates the lower bank signal BAiL and the upper bank signal BAiH, separately, depending on the most significant bit A<i> of the row address.

Based on the activation of the lower bank signal BAiL and the upper bank signal BAiH, the lower row pre-decoding unit 61 and the lower row controlling unit 62 under control of the lower bank signal BAiL and the upper row pre-decoding unit 63 and the upper row controlling unit 64 under control of the upper bank signal BAiH are selectively activated. The activated lower row controlling unit 62 or upper row controlling unit 64 activates the lower sense amplifier enable signal SAENL or the lower sense amplifier enable signal SAENH to activate the SA controlling unit 17.

In turn, the row address AX<0~i> is decoded through the activated row pre-decoding unit(one of the lower row pre-decoding unit 61 and the upper row pre-decoding unit 63) and the row decoding unit 18 to activate the corresponding word line WL. The SA controlling unit 17 is activated by the sense amplifier enable signals SAENL, SAENH that are generated by the activated row controlling unit(one of the lower row controlling unit 61 and the upper row controlling unit 63) to activate the sense amplifier block 19 so as to sense and amplify the memory cell data connected to the selected word line WL. After that, the input buffer/command decoding unit 10 decodes the external commands CLK, CKE, /RAS, /CAS, /WE so as to activate the read signal RD or the write signal WT. The column address latching unit 13 under control of the read signal RD and the write signal WT outputs the inputted address A<0~i> as the column address AY<0~i>. The column address AY<0~i> goes through the column pre-decoding unit 15 and the column decoding unit 21 to perform the read operation by selectively outputting the data from the sense amplifier block 19 or perform the write operation by over-writing external data onto the sense amplifier block 19. When the pre-charge command PRE_COM is inputted, the whole operation is finished.

Next, it will be described for the refresh operation when the selecting signal STRFC has logic level L.

First, the input buffer/command decoding unit 10 decodes the external command CLK, CKE, /RAS, /CAS, /WE to activate the refresh signal REF. The inner address counting unit 11 under control of the refresh signal REF generates the internal address IAX<0~i>. The row address latching unit 12 under control of the refresh signal REF receives the internal address IAX<0~i> to output it as the row address AX<0~i>. The bank signal generating unit generates the bank signal BAi by the active signal ACT that is generated by the refresh signal REF. The BA controlling unit 60 receives the bank signal BAi to simultaneously activate both of the lower bank signal BAiL and the upper bank signal BAiH. The lower row pre-decoding unit 61 and the upper row pre-decoding unit 63, each under control of the lower bank signal BAiL and the upper bank signal BAiH decode a part of the row address AX<0~I-1>, respectively. The row decoding unit 18 activates two word lines having the same row address but the most significant bit AX<i>. The lower row controlling unit 62 and the upper row controlling unit 64 under control of the lower bank signal BAiL and the upper bank signal BAiH activate the lower sense amplifier enable signal SAENL and the upper sense amplifier enable signal SAENH to activate the SA controlling unit 17 so as to sense and amplify the memory cell data in the selected word line through the sense amplifier block 18. The memory cell data that is sensed and amplified by the sense amplifier block 19 is stored at the memory array block 20 and then the refresh operation is finished with activation of the refresh pre-charge signal REBA.

For the reference, in the default case, because the selecting signal STRFC has logic level L, the similar process as described above is performed.

When the selecting signal has STRFC has logic level H, the BA controlling unit 60 activates the lower bank signal BAiL and activates the upper bank signal BAiH after a while. From then, the generated signals and operations are similar except that the blocks under control of the lower bank signal BAiL (the lower row pre-decoding unit 61 and the lower row controlling unit 62) are activated prior to the blocks under control of the upper bank signal BAiH (the upper row pre-decoding unit 63 and the upper row controlling unit 64) because the activation time point of the lower bank signal BAiL is prior to the upper bank signal BAiH.

It will be described for the prescribed operation with reference to FIG. 10 to 13.

Figure 10:
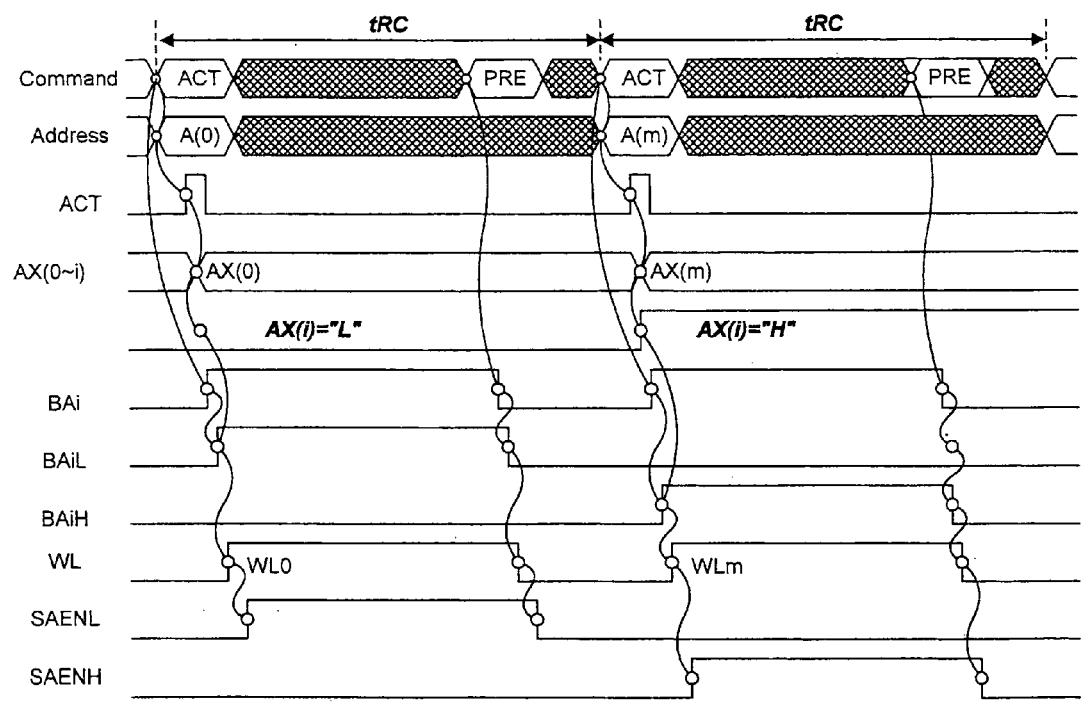
FIG. 10 presents a timing diagram of normal operation of the block in FIG. 6.

FIG. 10 presents a timing diagram of the normal operation of the semiconductor memory device having the row path controlling circuit according to the present invention.

Referring to FIG. 10, in the semiconductor memory device having the row path controlling circuit, the active signal ACT is activated in response to the activation of the active command ACT_COM and the address A(0) that is inputted along with the active command ACT_COM is activated as the row address AX(0). Further, the bank signal BAi is activated by the active command ACT_COM and the lower bank signal BAiL is activated by additional information about the most significant bit AX<i>=L of the row address. In response to this, the corresponding word line WL0 is activated and the lower sense amplifier enable signal SAENL is activated. After that, when the pre-charge command PRE_COM is inputted, the bank signal BAi, the lower bank signal BAiL, the corresponding word line WL0 and the lower sense amplifier enable signal SAENL are deactivated.

After that, when the active command ACT_COM and the address A(m) are inputted, a new normal operation is performed similarly as described above. Accordingly, depending on the logic value the most significant bit of the inputted address AX(i)=H, the upper bank signal BAiH and the upper sense amplifier enable signal SAENH are activated to activate the word line WLm. Therefore, it can be seen that similar normal operation is performed in the memory device of the present invention.

Figure 11:
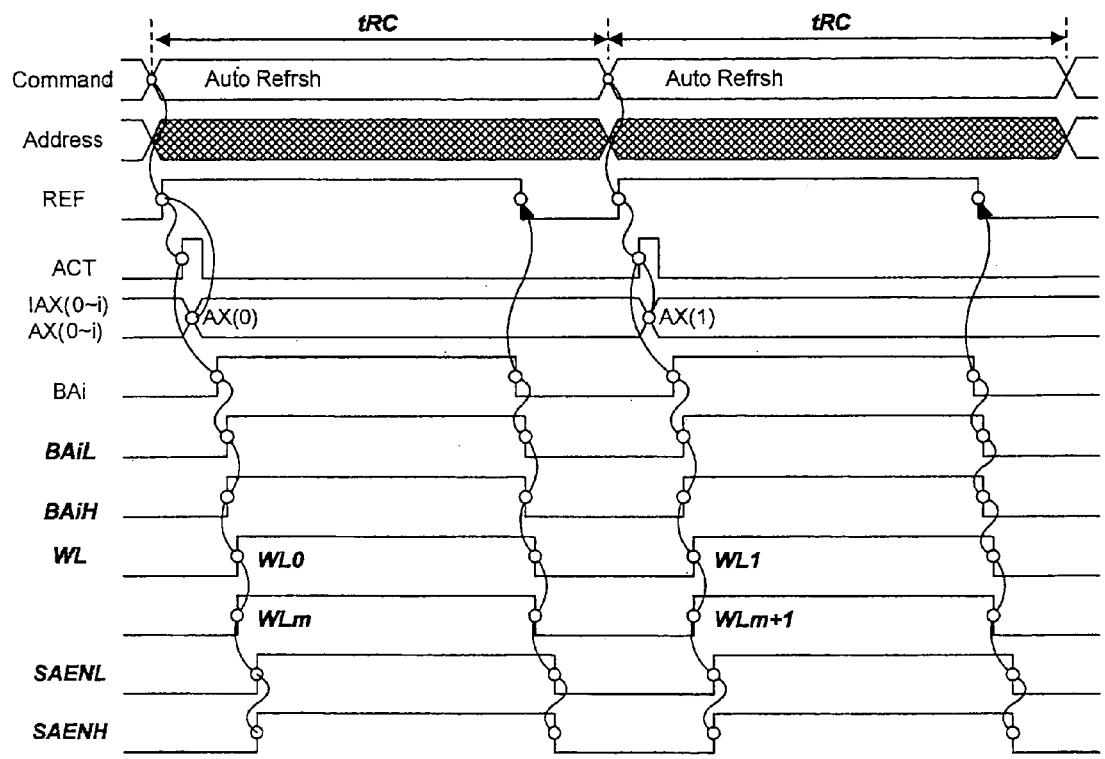
FIG. 11 offers a timing diagram of refresh operation based on default selection of the block in FIG. 6.

FIG. 11 offers a timing diagram of the refresh operation of the block in FIG. 6 based on default setting of the selecting signal STRFC. Prior to description, it will be described for the operation mode. The selecting signal STRFC has logic level L because of the default setting and two word lines are simultaneously re-stored during one cycle of the tRC.

Referring to FIG. 11, when the auto-refresh command AutoRefresh_COM is inputted, the refresh signal REF is activated and, accordingly, the active signal ACT is activated. In turn, the internal address IAX(0) is activated by the refresh signal REF to the row address AX(0). The bank signal BAi is activated in response to the active signal ACT and, in turn, the bank signal BAi activates the lower bank signal BAiL and the upper bank signal BAiH. In turn, the two word lines WL0, WLm that have the same row address except for the most significant bit AX<I> in the same bank are activated and the lower sense amplifier enable signal SAENL and the upper sense amplifier enable signal SAENH are activated to amplify the word lines. After that, from the deactivation of the bank signal BAi, the refresh signal REF, the lower bank signal BAiL, the upper bank signal BAiH, the selected word lines WL0, WLm, the lower sense amplifier enable signal SAENL and the upper sense amplifier enable signal SAENH are deactivated.

After that, when the auto-refresh command AutoRefresh_COM is re-inputted, the internal address IAX(1) is generated sequentially to refresh next two word lines WL1, WLm+1.

Figure 12:
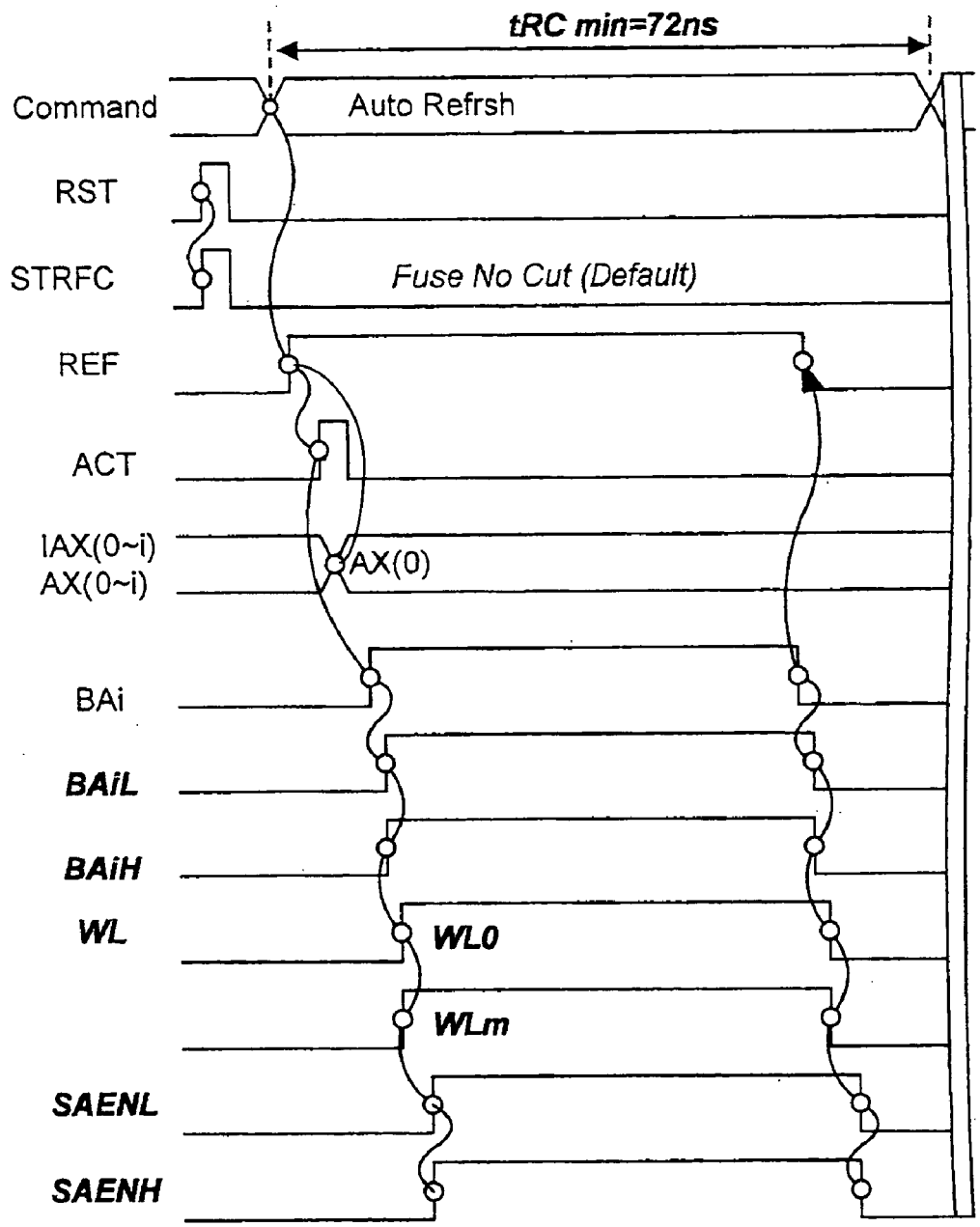
FIG. 12 illustrates a timing diagram of refresh operation of the block in FIG. 6 when tRCmin is 72 ns.

FIG. 12 illustrates a timing diagram of refresh operation of the block in FIG. 6 when tRCmin is 72 ns. Comparing it to FIG. 11, the control signals are generated similarly.

For the reference, when the reset signal RST is activated as a pulse, the selecting signal STRFC is activated as a pulse in response to the activation of the reset signal and then maintains logic value L, because the fuse is not disconnected.

Figure 13:
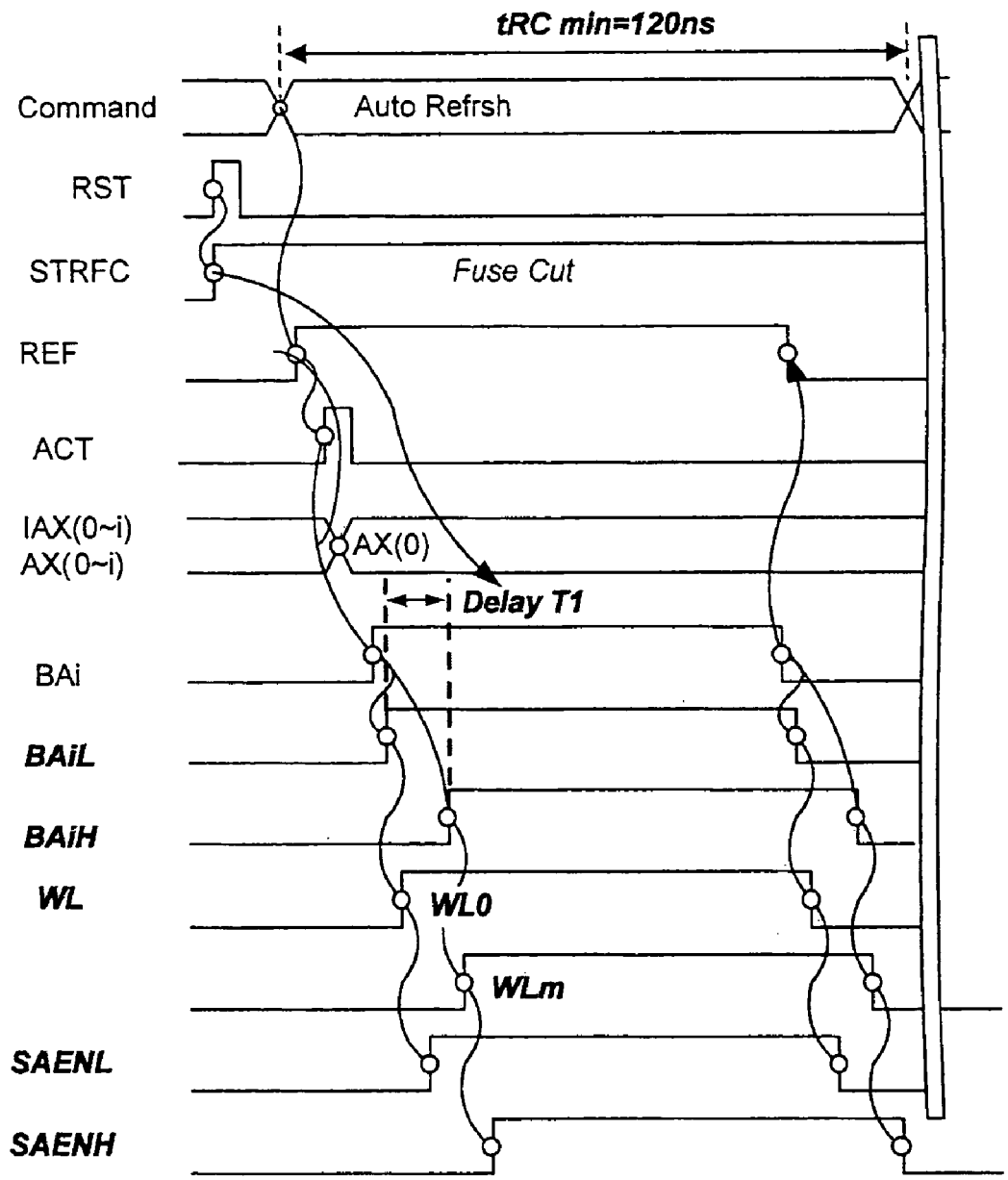
FIG. 13 shows a timing diagram of refresh operation of the block in FIG. 6 when tRCmin is 120 ns.

FIG. 13 shows a timing diagram of refresh operation of the block in FIG. 6 when tRCmin is 120 ns.

Prior to description, it will be described for the operation mode. Because the reset signal RST is activated as the pulse, the selecting signal STRFC has logic value H. Accordingly, two word lines are activated and re-stored with a time interval during a cycle of the tRC.

Referring to FIG. 13, when the auto-refresh command AutoRefresh_COM is inputted, the refresh signal is activated and, accordingly, the active signal ACT is activated. In turn, the internal address IAX<0~i> is generated by the refresh signal REF as the row address AX<0~i>. The bank signal BAi is activated in response to the active signal ACT and the bank signal BAi activates the lower bank signal BaiL and activates the upper bank signal BAiH after a while. In turn, the corresponding word line WL0 is activated by the lower bank signal BAiL and, after a while, the corresponding word line WLm is activated by the upper bank signal BAiH. In turn, the lower sense amplifier enable signal SAENL is activated by the lower bank signal BAiL and the upper sense amplifier enable signal SAENH is activated by the upper bank signal BAiH. Then, the refresh signal REF is deactivated in response to the deactivation of the bank signal Bai, and the lower bank signal BAiL, the word line WL0, the lower sense amplifier enable signal SAENL are deactivated. As similarly, the upper bank signal BAiH, the selected word line WLm and the upper sense amplifier enable signal SAENH are deactivated.

For the reference, T1 means the delay of the delaying unit 70 and can be adjusted by the delaying 70.

Referring to FIGS. 11 to 13, the semiconductor memory device of the present invention is capable of simultaneously activating or deactivating two word lines in a bank during a cycle of tRC in the refresh operation.

Further, for the 1 Gb semiconductor memory device, tRCmin can be supported to 72 ns. Therefore, when the present invention is applied to the 1 Gb semiconductor memory device, in a situation where semiconductor memory devices having different tRC are used in one system, two word lines can be activated with having a time interval within a cycle for reduction of peak current by simultaneously activating the two word lines per bank during a cycle of tRC.

Accordingly, the semiconductor memory device having the row path controlling circuit of the present invention is capable of selecting the activation scheme of the word line per cycle depending on setting of the selecting signal for the refresh operation. Therefore, the peak current can be reduced when the two word lines are activated at respective time point during a cycle, and the memory devices having different tRC can be used in a system when the two word lines are activated simultaneously.

The present application contains subject matter related to Korean patent applications No. 2003-76848, filed in the Korean Patent Office on Oct. 31, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device, comprising:
   a memory array block having a number of unit memory cells;
   command decoding means receiving external commands for generating a read signal, a write signal, a bank signal, an active signal and a refresh signal;
   bank controlling means for activating the bank signal as a first bank driving signal in response to the refresh signal and activating as a second bank driving signal after a delay;
   internal address counting means for generating an internal address in response to the refresh signal;
   row address latching means for selecting one of the internal address and the inputted address to output a row address;
   first decoding means for decoding the row address in response to the first bank driving signal to activate a word line in the memory array block;
   second decoding means for decoding the row address in response to the second bank driving signal to activate a word line in the memory array block;
   first row controlling means for activating a first sense amplifier enable signal in response to the first bank driving signal;
   second row controlling means for activating a second sense amplifier enable signal in response to the second bank driving signal; and
   a sense amplifier block for sensing and amplifying memory cell data of the activated word line in response to the first sense amplifier enable signal and the second sense amplifier enable signal.

2. The semiconductor memory device of claim 1, wherein the internal address has one fewer bits than the address of the memory device.

3. The semiconductor memory device of claim 2, wherein the row address latching means outputs the internal address as the row address when the refresh signal is activated, and outputs the address as the row address when the active signal is activated.

4. The semiconductor memory device of claim 3, wherein the bank controlling means selectively activates one of the first bank driving signal and the second bank driving signal depending on a logic value of a particular bit of the address when the refresh signal is deactivated, and activates the first bank driving signal in response to activation of the refresh signal and activates the second bank driving signal after the delay.

5. The semiconductor memory device of claim 4, wherein the first decoding means and the first row controlling means control one half of a bank, and the second decoding means and the second row controlling means control the other half of the bank.

6. The semiconductor memory device of claim 5, further comprising:
   column address latching means for outputting a column address under control of the read signal or the write signal; and
   column address decoding means for decoding the column address to select a column line.

7. A semiconductor memory device, comprising:
   a memory array block having a number of unit memory cells;
   command decoding means for receiving external commands to generate a read signal, a write signal, a bank signal, an active signal and a refresh signal;
   selecting signal generating means for generating a selecting signal to select an activation scheme for a word line in a cycle;
   bank controlling means for adjusting activation time points of a first bank driving signal and a second bank driving signal in response to the selecting signal;
   internal address counting means for generating an internal address in response to the refresh signal;
   row address latching means for selecting one of the internal address and an inputted address to output as a row address;
   first decoding means for decoding the row address in response to the first bank driving signal to activate a word line in the memory array block;
   second decoding means for decoding the row address in response to the second bank driving signal to activate a word line in the memory array block;
   first row controlling means for activating a first sense amplifier enable signal in response to the first bank driving signal;
   second row controlling means for activating a second sense amplifier enable signal in response to the second bank driving signal; and
   a sense amplifying block for sensing and amplifying memory cell data in the activated word line in response to the first sense amplifier enable signal and the second sense amplifier enable signal.

8. The semiconductor memory device of claim 7, wherein the bank controlling means simultaneously activates the first bank driving signal and the second bank driving signal in response to the activation of the bank signal when the selecting signal and the refresh signal are activated, and activates the first bank driving signal in response to the activation of the bank signal and activates the second bank driving signal after a delay when the selecting signal is deactivated and the refresh signal is activated.

9. The semiconductor memory device of claim 8, wherein the bank controlling means selectively activates one of the first bank driving signal and the second bank driving signal depending on a logic value of a particular bit of the address in response to the activation of the bank signal when the refresh signal is deactivated.

10. The semiconductor memory device of claim 9, wherein the internal address has one fewer bits than the address of the memory device.

11. The semiconductor memory device of claim 10, wherein the row address latching means outputs the internal address as the row address when the refresh signal is activated, and outputs the address as the row address when the active signal is activated.

12. The semiconductor memory device of claim 11, wherein the first decoding means and the first row controlling means control one half of one bank, and the second decoding means and the second row controlling means control the other half of the bank.

13. The semiconductor memory device of claim 12, wherein the selecting signal generating means is formed with a fuse option and a pad bonding.

14. The semiconductor memory device of claim 13, further comprising:
- column address latching means for outputting a column address under control of the read signal or the write signal; and
- column address decoding means for decoding the column address.

15. The semiconductor memory device of claim 14, wherein the selecting signal generating means includes:
- a fuse coupled between a first power voltage and a node;
- a first MOS transistor having a reset signal as its gate input;
- a second MOS transistor and a third MOS transistor, having the first power voltage as their gate inputs, respectively, the first to third MOS transistors being serially coupled between the node and a second power voltage;
- a first inverter for inverting the signal on the node;
- a fourth MOS transistor having the output signal of the first inverter as its gate input and a drain-source path between the node and the second power voltage; and
- an inverter chain including a second inverter and a third inverter for latching the output signal of the first inverter to output the selecting signal.

16. The semiconductor memory device of claim 14, wherein the selecting signal generating means includes:
- a pad for bonding to one of the first power voltage and the second power voltage; and
- a resistor, a third inverter and a fourth inverter, all being serially coupled sequentially from the pad for outputting the selecting signal.

17. A driving method for performing a refresh cycle in a semiconductor memory device, comprising the steps of:
  (a) activating a refresh signal in response to input of external commands;
  (b) activating a bank signal in response to the refresh signal and generating an internal address;
  (c) activating a first bank driving signal in response to the bank signal and activating a second bank driving signal after a delay;
  (d) activating a word line corresponding to the internal address in response to the first bank driving signal;
  (e) activating a word line having an address as same as the activated word line but one particular bit;
  (f) deactivating the first bank driving signal in response to deactivation of the bank signal and deactivating the second bank driving signal after the delay;
  (g) deactivating the word line in response to the deactivation of the first bank driving signal; and
  (h) deactivating the other word line in response to the deactivation of the second bank driving signal.

18. A driving method for performing a refresh cycle in a semiconductor memory device, comprising the steps of:
  (a) activating a refresh signal in response to input of external commands;
  (b) activating a bank signal in response to the refresh signal and generating an internal address;
  (c) simultaneously activating a first bank driving signal and a second bank driving signal in response to the bank signal;
  (d) simultaneously activating two word lines corresponding to the internal address and having the respective addresses that are equal to each other except for a particular bit in response to the first bank driving signal and the second bank driving signal;
  (e) deactivating the first bank driving signal and the second bank driving signal in response to deactivation of the bank signal; and
  (f) deactivating the two word lines in response to the deactivation of the first bank driving signal and the second bank driving signal.

19. A semiconductor memory device, comprising:
- a bank having a number of unit memory cells;
- command decoding means for generating a bank signal and a refresh signal in response to external commands;
- bank controlling means for driving the bank in response to the bank signal and the refresh signal to output a first bank driving signal and a second bank driving signal;
- first decoding means for driving a plurality of first rows in the bank in response to the first bank driving signal; and
- second decoding means for driving a plurality second rows in the bank in response to the second bank driving signal,
- wherein the bank controlling means adjusts the enable time points of the first and the second bank driving signals in response to input of a selecting signal that corresponds to an activation scheme for the word line in a cycle.

20. The semiconductor memory device of claim 19, further comprising:
- column address latching means for outputting a column address under control of the read signal or the write signal; and
- column address decoding means for decoding the column address.

* * * * *